United States Patent
Rachbauer et al.

(10) Patent No.: US 9,506,139 B2
(45) Date of Patent: Nov. 29, 2016

(54) TI—AL—TA-BASED COATING EXHIBITING ENHANCED THERMAL STABILITY

(71) Applicant: Oerlikon Surface Solutions AG, Trubbach, Trubbach (CH)

(72) Inventors: Richard Rachbauer, Feldkirch (AT); Robert Hollerweger, Henndorf (AT); Christian Martin Koller, Troisach (AT); Paul Heinz Mayrhofer, Neckenmarkt (AT)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 0 days.

(21) Appl. No.: 14/426,458

(22) PCT Filed: Sep. 4, 2013

(86) PCT No.: PCT/EP2013/002658
§ 371 (c)(1),
(2) Date: Mar. 6, 2015

(87) PCT Pub. No.: WO2014/037104
PCT Pub. Date: Mar. 13, 2014

(65) Prior Publication Data
US 2015/0259782 A1    Sep. 17, 2015

(30) Foreign Application Priority Data
Sep. 8, 2012 (DE) .................. 10 2012 017 731

(51) Int. Cl.
*C23C 14/32* (2006.01)
*C23C 14/06* (2006.01)
*C23C 28/04* (2006.01)
*C23C 28/00* (2006.01)
*C23C 14/34* (2006.01)

(52) U.S. Cl.
CPC ....... *C23C 14/0617* (2013.01); *C23C 14/0641* (2013.01); *C23C 14/325* (2013.01); *C23C 14/345* (2013.01); *C23C 28/042* (2013.01);
(Continued)

(58) Field of Classification Search
USPC ........... 51/307, 309; 428/216, 697, 698, 699
See application file for complete search history.

(56) References Cited

U.S. PATENT DOCUMENTS

| 6,811,581 B2 * | 11/2004 | Yamada | B23F 21/16 |
| | | | 428/216 |
| 7,521,132 B2 | 4/2009 | Kathrein | |
| 2006/0246320 A1 | 11/2006 | Kathrein | |

FOREIGN PATENT DOCUMENTS

| EP | 1 378 304 A2 | 1/2004 |
| EP | 1 452 621 A2 | 9/2004 |

(Continued)

OTHER PUBLICATIONS

Major, et al., "Crystallographic Aspects Related to Advanced Tribological Multilayers of Cr/CrN and Ti/TiN Types Produced by Pulsed Laser Deposition (PLD)", Surface and Coatings Technology, vol. 200, No. 22-23, Dec. 9, 2005, pp. 6190-6195, Elsevier, Amsterdam.

*Primary Examiner* — Archene Turner
(74) *Attorney, Agent, or Firm* — Pearne & Gordon LLP (57) ABSTRACT

A wear resistant coating system including a tantalum-containing multilayered film having n A layers and m B layers, where n and m are integral numbers larger than I, deposited alternating one on each other. The multilayered film exhibits crystalline cubic structure, and is characterized in that the B layers include tantalum and the A layers exhibit a higher defect density than the B layers.

14 Claims, 8 Drawing Sheets

(52) U.S. Cl.
CPC ............ *C23C 28/044* (2013.01); *C23C 28/42* (2013.01); *Y10T 428/2495* (2015.01)

(56) References Cited

FOREIGN PATENT DOCUMENTS

| | | | |
|---|---|---|---|
| EP | 1 400 609 | B1 | 11/2006 |
| EP | 1 722 009 | B1 | 10/2008 |
| EP | 2 096 811 | A2 | 9/2009 |
| JP | 6330347 | A | 2/1988 |
| JP | H07-26386 | A | 1/1995 |
| JP | H07-331410 | A | 12/1995 |
| JP | 2007-015071 | A | 1/2007 |
| WO | 2009/003206 | A2 | 1/2009 |
| WO | 2009/105024 | A1 | 8/2009 |

* cited by examiner

- c-TiAlN stable up to 800°C
- c-$Ti_{0.45}Al_{0.36}Ta_{0.19}N$ stable up to 1100°C
- $Ti_{0.31}Al_{0.50}Ta_{0.19}N$: mixed cubic-wurzite (c/w) structure in as. dep. state
- h-$Ta_2N$ formation at $T_a \geq 1300°C$
- hardness measurements support XRD findings

* L. Chen, K. K. Chang, Y. Du, J. R. Li, M. J. Wu, Thin Solid Films 519 (2011) 3762-3767

TI—AL—TA-BASED COATING EXHIBITING ENHANCED THERMAL STABILITY

The present invention relates to a wear resistant coating system 20 having the features described in the claims, particularly to be used for wear protection of bodies, such as tools and components used in tribological systems. Particularly, this coating system should combine good hardness after exposition at elevated temperatures and good oxidation resistance. Moreover, the present invention relates to a coated body 1 exhibiting the features described in the claims and a method of manufacturing a coated body 1 comprising the features described in the claims.

STATE OF THE ART

Titanium aluminum nitride (TiAlN) coatings are well-established coatings for wear protection of tools and components. Usually, TiAlN coating are deposited on the substrates by means of physical vapor deposition (PVD) techniques. Because of its very good combination of wear resistance properties and thermal stability TiAlN coating systems have been very good studied. Special attention has been given to the influence of the Al-content in the thermal stability of this kind of coatings.

Furthermore many variants of TiAlN-based coatings which are basically doped with other elements are well-studied. All these doped TiAlN coatings should have any advantage for a determined application.

In many patent documents it has been reported about the benefit that can be attained by doping TiAlN coatings with tantalum. For example, in U.S. Pat. No. 7,521,132B2 is disclosed a coated tool whose coating comprises at least one coating layer having a composition (TiaAlbTac) N, where a+b+c=1; $0.3 \leq b \leq 0.75$; $0.001 \leq c \leq 0.30$, and at least one coating layer having a composition (TidAleTafMg)N, where d+e+f+g=1; $0.50 \leq e \leq 0.70$; $0 \leq f \leq 0.25$, and M is one or more elements selected from the group consisting of Si, V, B, with for Si: $0.0005 \leq g \leq 0.10$; for V: $0.001 \leq g \leq 0.25$ and for B: $0.00005 \leq g \leq 0.01$. Furthermore, it is disclosed in the same patent document a sputtering target for coating the tool which consists of Al (30 to 75 at. %), Ta (0.1 to 30 at. %) and remainder Ti. Moreover, it is disclosed a sputtering target for coating the tool which consists of Al, Ta, Ti and at least Si, V or B.

Similarly Ti—Al—Ta—N comprising monolayer and multilayer coating systems are described in WO2009003206, WO2009105024, EP2096811, EP1722009, EP1378304, EP1400609, EP1452621, EP1378304, JP7331410, JP7026386, JP6330347 and JP2007015071.

However, in spite of all these developments and studies, there is still need for improvements.

Particularly for increasing protection and cutting performance of cutting tools, it remains a challenge to attain a sufficiently good combination of toughness and thermal stability which allows meeting the current demands.

OBJECTIVE OF THE PRESENT INVENTION

Main objective of the present invention is to provide a coating system which combines a very good toughness and thermal stability at the same time. Preferably, this coating system should combine good hardness after exposition at elevated temperatures and good oxidation resistance. Further, it is an objective of the present invention to provide a method for its production.

DESCRIPTION OF THE PRESENT INVENTION

Figure 1:
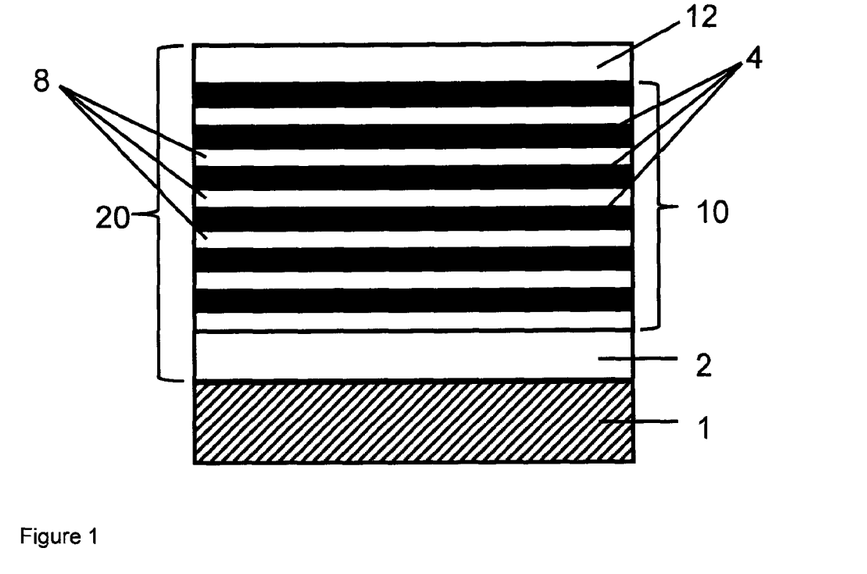
FIG. 1 shows schematically a coating system.

The main objective of the present invention is attained by providing a wear resistant coating system 20, as it is schematically drafted in FIG. 1, which comprises a tantalum containing multilayered film 10 consisting of A layers 4, A1, A2, A3, ... An and B layers 8, B1, B2, B3, ... Bm deposited alternating one on each other. The multilayered film 10 exhibiting crystalline cubic structure and the A layers exhibiting higher defect density than the B layers.

Particularly good results are obtained when the B layers comprise tantalum.

The inventors analyzed different combinations of multi-layer coatings and compared them with monolayer coatings.

For the experiments (detailed information about the experiments is provided in the FIGS. 2 to 8), titanium aluminum nitride and titanium aluminum tantalum nitride monolayer coatings (also referred to as monolithic coatings in the context of the present invention) were deposited by means of arc ion plating techniques from alloyed targets. For the experiments alloyed targets having chemical composition $Ti_{0.5}Al_{0.5}$, $Ti_{0.45}Al_{0.45}Ta_{0.1}$ and $Ti_{0.3}Al_{0.6}Ta_{0.1}$ were used.

Additionally, multilayer coating systems comprising A and B layers were deposited. For the experiments, the A layers were deposited from titanium aluminum composite targets having chemical composition $Ti_{0.5}Al_{0.5}$, while the B layers were deposited from tantalum aluminum composite targets having chemical composition $Ta_{0.75}Al_{0.25}$.

Figure 2:
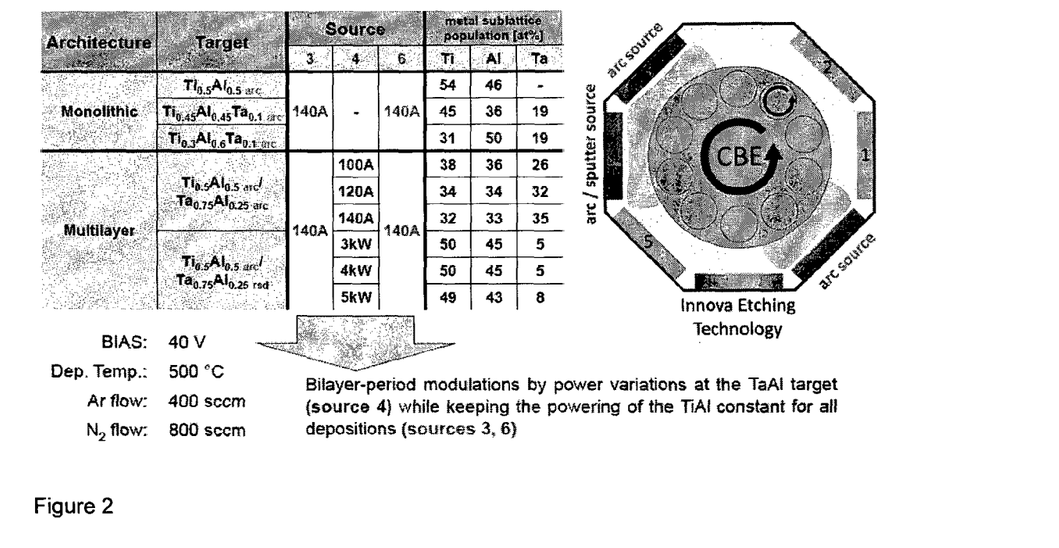
FIG. 2 shows coating parameters.

In order to vary the defect density two different PVD techniques were used: arc ion plating and magnetron sputtering ion plating. The used coating parameters are shown in FIG. 2.

Other possible way for obtaining different defect densities in the layers A and B but using only arc ion plating deposition techniques is for example by adjusting the coil current in each case.

High-resolution transmission electron microscopy (HR-TEM) techniques can be used for measuring the defect density of the layers A and B.

Preferably, the chemical composition of the A and B layers is given by the formulas with the coefficients in atomic percentage:

$Me^1_{1-x}Al_xN_zX_{1-z}$ for the A layers and $Me^2_{1-x-y}Al_x Ta_yN_zX_{1-z}$, for the B layers, where:

$Me^1$ is one or more elements from: Ti, Cr, V, Ta, Nb, Zr, Hf, Mo, Si and W, and $Me^2$ is one or more elements from: Ti, Cr, V, Nb, Zr, Hf, Mo, Si and W, and X is one or more of the elements from: O, C, and B, and $0.2 \leq x \leq 0.7$, $0.7 \leq z \leq 1$, $0.02 \leq y \leq 0.80$ It was observed a better thermal stability when the thickness of the B layers was smaller than the thickness of the A layers: A1>B1, A2>B2, A3>B3 ... An>Bm.

Preferably, a coated body 1 according to the present invention is deposited using PVD techniques.

In a preferred embodiment of the present invention the coating system 20 is deposited by means of arc ion plating techniques.

In a further preferred embodiment of the present invention the coating system 20, the A layers 4 are deposited by means of arc ion plating techniques and the B layers 8 are deposited by means of sputtering techniques.

Furthermore the present invention relates to a method of manufacturing a body 1 coated with a coating system 20 according to the present invention.

In one embodiment of the present invention the coated body 1 is coated by means of physical vapor deposition techniques.

In a preferred embodiment of a method according to the present invention the physical vapor deposition techniques used are arc ion plating deposition techniques, particularly reactive arc ion plating deposition techniques.

In a further preferred embodiment of a method according to the present invention for adjusting the desired defect density in the layers A and B the coil current is adjusted correspondingly.

In one more further preferred embodiment of a method according to the present invention the physical vapor deposition techniques used are sputtering or high ionization magnetron sputtering techniques such as high-power impulse magnetron sputtering (HIPIMS), particularly reactive magnetron sputtering deposition (rsd) techniques.

Preferably, at least in some cases, a method according to the present invention involves the use of at least one target (source material) for the deposition of the layers A and/or B which is made by powder metallurgy techniques.

In a further embodiment of the present invention, the coating system 20 include at least one more layer additionally to the multilayered film 10, for example one or more adhesion improving layers 2, and/or one or more above of the multilayered film 10 deposited layer 12. The at least one layer 12 can be for example a top layer having friction reducing properties and/or especially color properties.

In one preferred embodiment of the present invention, the thickness of each one of the A layers and B layers is preferably between 3 nm and 300 nm, more preferably between 3 nm and 100 nm. Nitrogen and/or at least one element composing X (if it is given) are preferably incorporate in the multilayered film 10 from the reactive gas.

Figure 3:
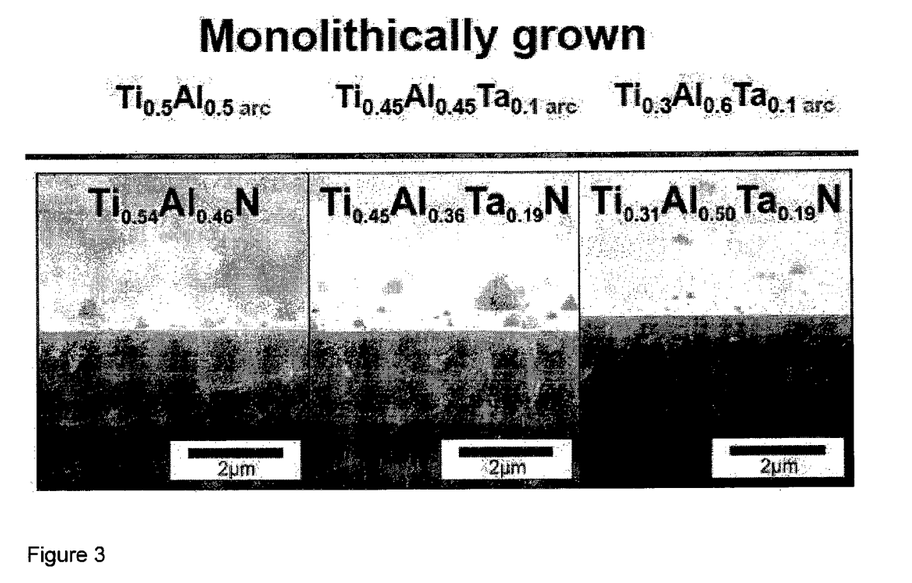
FIGS. 3, 4, and 5 show results of tests used to analyze properties of monolayer coatings.
Figure 4:
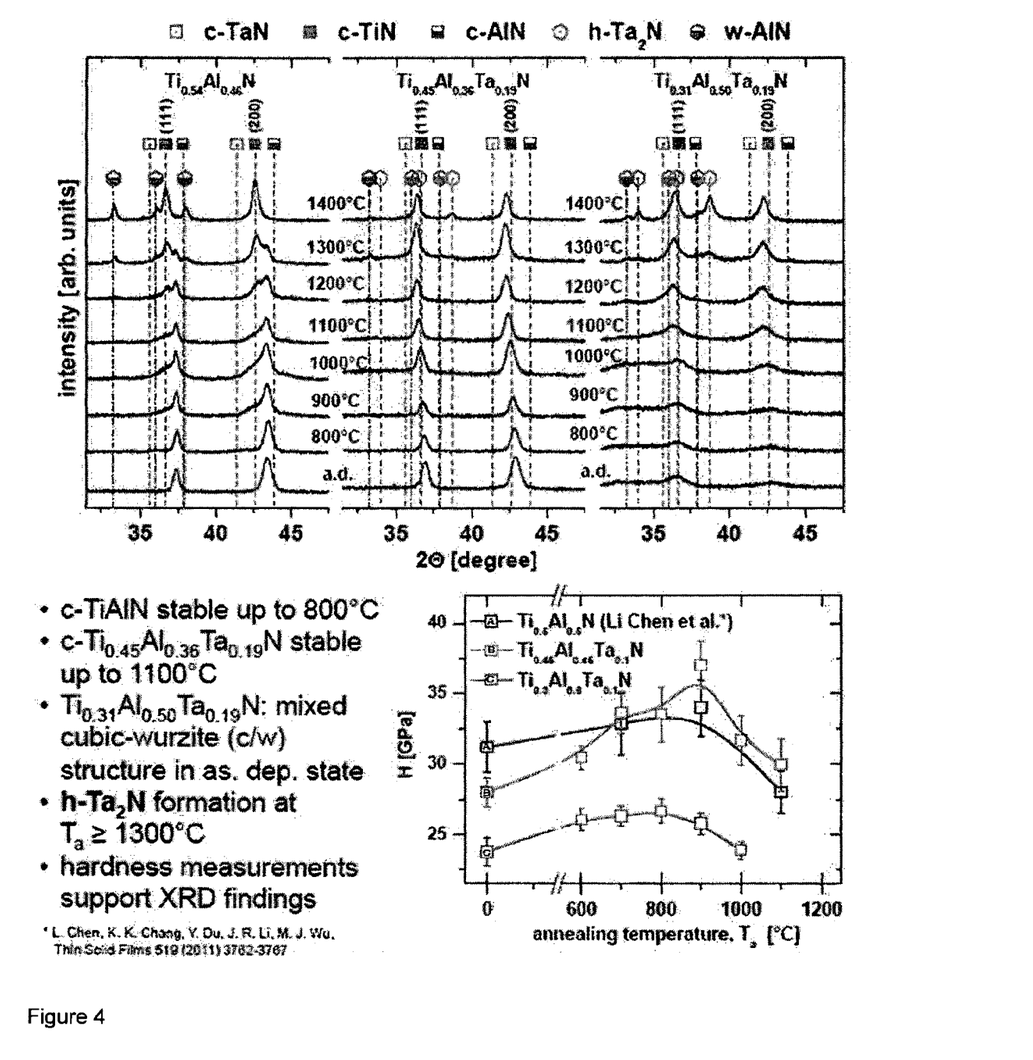
Figure 5:
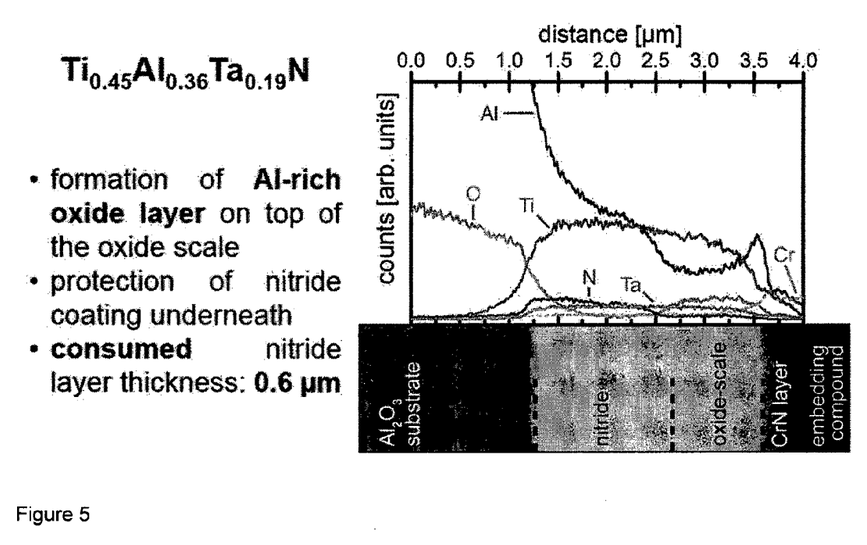
Figure 6:
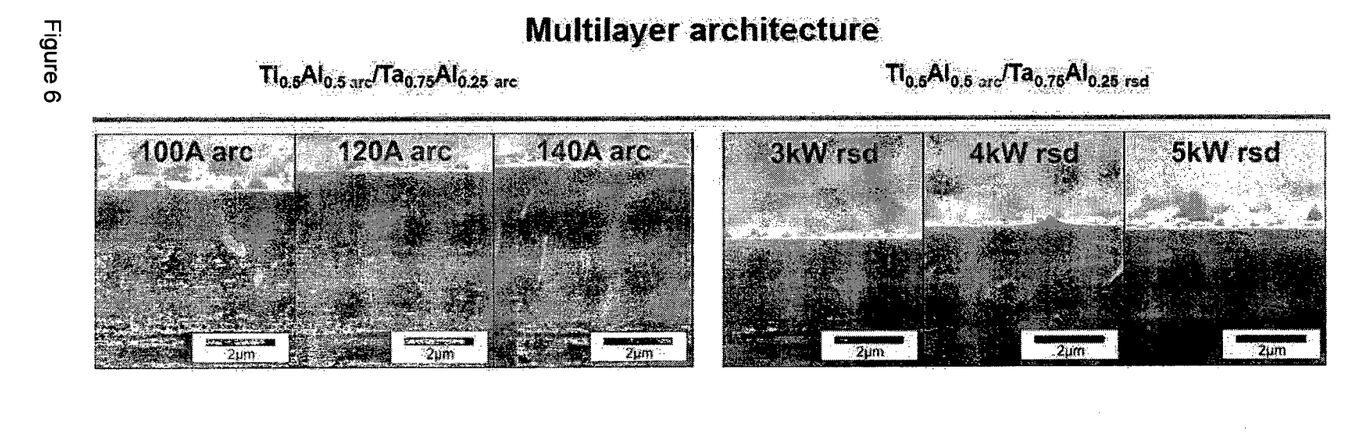
FIGS. 6, 7, and 8 show results of tests used to analyze properties of multilayer coatings.
Figure 7:
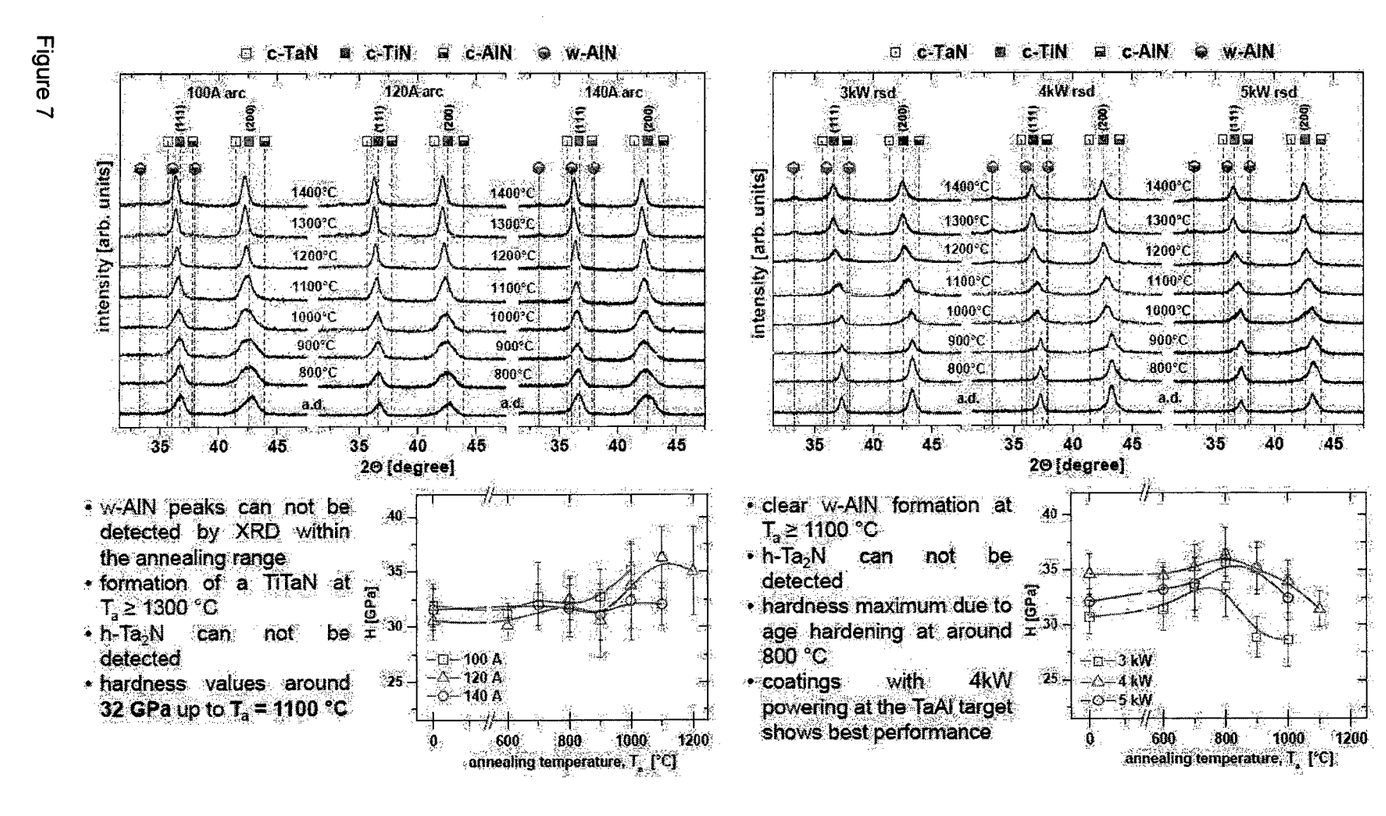
Figure 8:
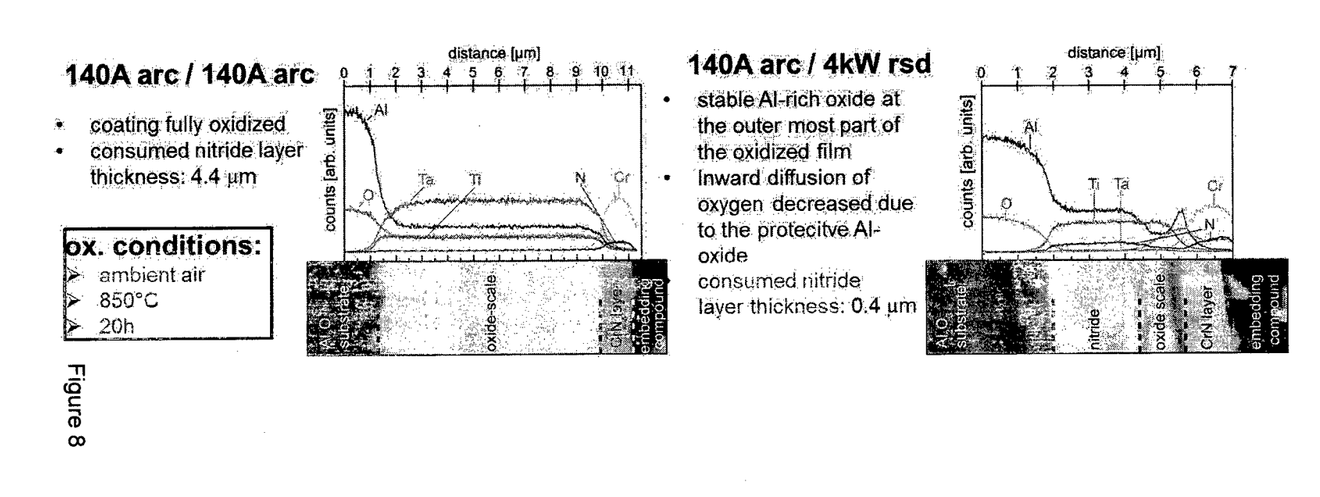

The FIGS. 3 to 5 show the results of the experimental tests realized in order to characterize and analyze the properties of the monolayer coatings (monolithically grown coatings), while the FIGS. 6 to 8 show the results of the experimental tests realized in order to characterize and analyze the properties of the coatings having a multilayer structure.

The CrN layer observed in the FIGS. 5 and 8 in the scanning electron micrographs and also detected by the analysis of the element composition of the characterized coatings in order to study the oxidation behavior was deposited after the oxidation process in order to prepare the samples for the analysis.

Hardness and X-ray diffraction (XRD) spectrums shown in the FIGS. 4 and 7 were measured at room temperature after each annealing process in order to analyze the thermal stability of the coatings.

Analyzing the XRD spectrums of the monolithically grown $Ti_{0.54}Al_{0.46}N$ and $Ti_{0.45}Al_{0.36}Ta_{0.19}N$ coatings after deposition, it was observed that they indicate cubic structure while the $Ti_{0.31}Al_{0.50}Ta_{0.19}N$ coatings exhibit already mixed cubic/hexagonal (c/w) phase structure. However, all coatings deposited having a multilayered structure TiAlN/TaAlN exhibited cubic structure after deposition (according to the XRD spectrums), both those deposited using arc evaporation techniques ($TiAlN_{arc}/TaAlN_{arc}$) and those deposited using hybrid arc/sputter techniques ($TiAlN_{arc}/TaAlN_{rsd}$). For these experiments, the $TiAlN_{arc}/TaAlN_{arc}$ coatings were not deposited in order to obtain multilayered coatings whose TaAlN layers have a higher defect density than the TaAlN layers. But in the case of the $TiAlN_{arc}/TaAlN_{rsd}$, it was intended to produce TaAlN layers having a lower defect density that the TiAlN layers.

In relation to the thermal stability, the multilayered $Ti_{0.5}Al_{0.5arc}/Ta_{0.75}Al_{0.25arc}$ coatings showed best thermal stability regarding age hardening behavior, considering the hardness measured after the annealing processes (as it is shown in FIG. 7, below on the left side) but bad thermal stability regarding oxidation resistance as it is shown in FIG. 8 on the left side. These coatings were completely oxidized after 20 hours at 850° C. Otherwise, the monolithically grown $Ti_{0.45}Al_{0.36}Ta_{0.19}N$ coatings and the hybrid deposited $Ti_{0.5}Al_{0.5arc}/Ta_{0.75}Al_{0.25rsd}$ multilayer coatings showed similar good thermal stability.

Regarding hardness measured after the annealing processes both of these types of coatings showed relative good age hardening behavior (as it is shown in FIG. 4 and FIG. 7, below on the right side) and very good thermal stability regarding oxidation resistance as it is shown in FIG. 5 and in FIG. 8 on the right side).

Crystalline PVD-deposited layers are actually polycrystalline layers which comprise more than one (usually several) crystalline grains. The growth way of the crystalline grains results in a determined layer morphology. Different morphologies are characterized by comprising different quantity of defects.

The term defect density in the context of the present invention is particularly referred to the area or volume corresponding to defects which are comprised in a determined area or volume of a grain boundary phase inside of an A- or a B-layer.

The defect density in the context of the present invention correlates necessarily with microscopic point-, line- and area-defects (e.g. vacancies, interstitials, dislocations, stacking faults) stemming from individual phase fractions of a disordered grain boundary phase. The defect density of the layers A and B according to the present invention can be for example estimated by using X-ray diffraction (XRD) and/or transmission electron microscopy (TEM).

By way of example, an about 1 micrometer thick A-layer consisting of TiAlN and exhibiting a fine-grained structure, an about 1 micrometer thick B-layer consisting of TiAlTaN and exhibiting a columnar-grained structure and an about 1 micrometer thick multilayered film comprising several A- and B-layers of the types mentioned before were examined by using X-ray techniques. The obtained X-ray spectrums are shown in the FIG. 9.

Figure 9:
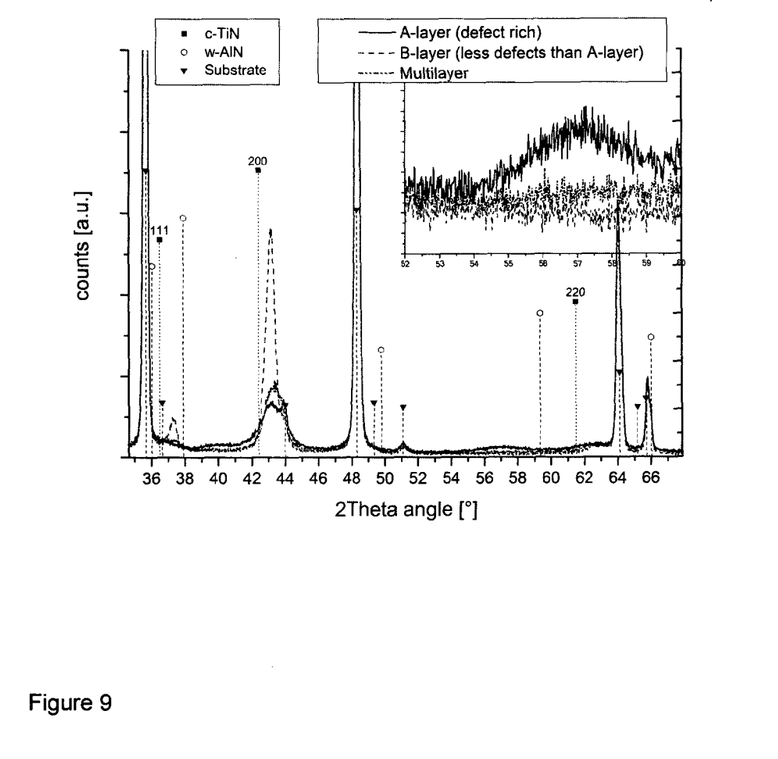
FIG. 9 shows X-ray spectrums of coating layers.
Figure 10:
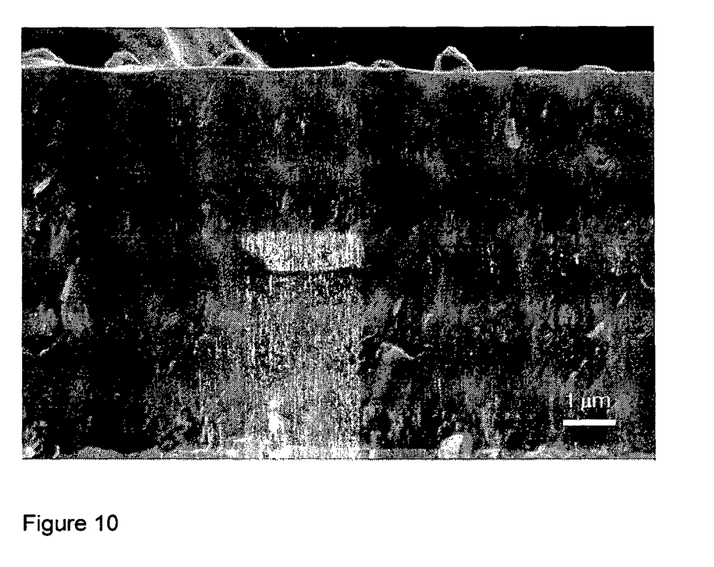
FIG. 10 shows a photograph.

The X-ray spectrum of the examined layer A is characterized by a broad XRD signal 52<2Theta<60°. Typically single layers A according to the present invention should exhibit a predominant (002)-orientation. On the contrary, the X-ray spectrum of the examined layer B is characterized by missing XRD signal in the same 2Theta range, which is an indication of a lower amount of grain boundary phase in comparison with the layer A and consequently of a lower defect density in the context of the present invention.

According to the realized X-ray examinations, the structure of the examined layer A comprises nanometer-sized grains (having a grain size <15 nm) and consequently exhibits a defect-rich grain boundary phase fraction.

As also shown in the FIG. 9, a typical XRD pattern from a multilayered film comprising layers A and B deposited alternately one on each other according to the present invention can exhibit predominant (002)-orientation and moreover some amount of grain boundary signal.

The thickness of each one of the A layers and B layers is not limited by the above mentioned preferred embodiments and could be for example for some applications between 3 nm and 3000 nm or between 3 nm and 500 nm.

The thickness of each one of the A layers for some applications is preferably at least 15% larger than the thickness of each one of the correspondingly B layers which are deposited alternate with the A layers (forming the multilayer architecture), i.e. A1-layer thickness≥1.15 B1-layer thickness, A2-layer thickness≥1.15 B2-layer thickness, . . . , An-layer thickness≥1.15 Bm-layer thickness.

In a further preferred embodiment of the present invention, the thickness of each one of the A layers is at least 25% larger than the thickness of each one of the correspondingly B layers which are deposited alternate with the A layers.

In one more preferred embodiment of the present invention, the thickness of each one of the A layers is between 30% and 50% larger than the thickness of each one of the correspondingly B layers which are deposited alternate with the A layers.

Summarizing the idea the wear resistant coating system (20) according to the present invention comprises a tantalum containing multilayered film (10) consisting of n A layers (4) and m B layers (8), where n and m are integral numbers larger than 1, deposited alternate one on each other, said multilayered film (10) exhibiting crystalline cubic structure, characterized in that the B layers comprises tantalum and the A layers exhibit a higher defect density than the B layers.

The chemical composition of the A and B layers in the coating system is preferably given by the following formulas with the coefficients in atomic percentage:

$Me^1_{1-x}Al_xN_zX_{1-z}$ for the A layers and $Me^2_{1-x-y}Al_x Ta_yN_zX_{1-z}$, for the B layers, where:

$Me^1$ is one or more elements from: Ti, Cr, V, Ta, Nb, Zr, Hf, Mo, Si and W, and $Me^2$ is one or more elements from: Ti, Cr, V, Nb, Zr, Hf, Mo, Si and W, and X is one or more elements from: O, C and B, and $0.2 \leq x \leq 0.7$, $0.7 \leq z \leq 1$, $0.02 \leq y \leq 0.80$ The thickness of the B layers is preferably smaller than the thickness of the A layers: A1>B1, A2>B2, A3>B3 . . . An>Bm.

Preferably, the thickness of the A layers is at least 15% larger than the thickness of the B layers: A1≥1.15 B1, A2≥1.15 B2, A3≥1.15 B3 . . . An≥1.15 Bm.

The present invention discloses also a coated body comprising a body (1) and an inventive coating system (20) which can be deposited on at least a portion of the surface of the body (1).

The multilayered film (10) of the coating system (20) comprised in the coated body according to the present invention is preferably deposited by means of PVD techniques.

The B layers of the multilayered film (10) can be deposited by means of magnetron sputtering ion plating techniques or high ionization magnetron sputtering techniques.

The A layers can be deposited by means of arc ion plating techniques.

A preferred method for manufacturing a coated body according to the present invention involves the deposition of the A layers and/or the B layers on the substrate by means of PVD techniques.

Preferably, reactive physical vapor deposition techniques are used for depositing the A layers and/or the B layers.

Preferably, the nitrogen fraction and/or at least one of the elements comprised in the X component of the coating system are incorporated from a reactive gas or from a reactive gas mixture in the A and/or B layers, respectively.

The multilayered film (10), i.e. both the A- and B-layers can be deposited by means of arc ion plating techniques.

In this case, the desired defect density in the layers A and B can be adjusted by adjusting the coil current correspondingly.

Preferably, at least one target used as source material for depositing the A- and/or B-layers is made by powder metallurgy techniques.

What is claimed is:

1. Wear resistant coating system (20) comprising a tantalum containing multilayered film (10) consisting of n A layers (4) and m B layers (8), where n and m are integral numbers larger than 1, deposited alternate one on each other, said multilayered film (10) exhibiting crystalline cubic structure, characterized in that the B layers comprises tantalum and the A layers exhibit a higher defect density than the B layers.

2. Coating system according to claim 1, characterized in that the chemical composition of the A and B layers is given by the formulas with the coefficients in atomic percentage:

$Me^1_{1-x}Al_xN_zX_{1-z}$ for the A layers and $Me^2_{1-x-y}Al_x Ta_yN_zX_{1-z}$, for the B layers, where:

$Me^1$ is one or more elements from: Ti, Cr, V, Ta, Nb, Zr, Hf, Mo, Si and W, and $Me^2$ is one or more elements from: Ti, Cr, V, Nb, Zr, Hf, Mo, Si and W, and X is one or more elements from: 0, C and B, and $0.2 \leq X \leq 0.7$, $0.7 \leq Z \leq 1$, $0.02 \leq y \leq 0.80$.

3. Coating system according to claim 2, characterized in that the thickness of the B layers is smaller than the thickness of the A layers: A1>B1, A2>B2, A3>B3 . . . An>Bm.

4. Coating system according to claim 3, characterized in that the thickness of the A layers is at least 15% larger than the thickness of the B layers: A1≥1.15 B1, A2≥1.15 B2, A3≥1.15 B3 . . . An≥1.15 Bm.

5. Coated body comprising a body (1) and a coating system (20) according to claim 1 deposited on at least a portion of the surface of the body (1).

6. Coated body according to claim 4, characterized in that the multilayered film (10) of the coating system (20) is deposited by means of PVD techniques.

7. Coated body according to claim 6, characterized in that the B layers of the multilayered film (10) are deposited by means of magnetron sputtering ion plating techniques or high ionization magnetron sputtering techniques.

8. Coated body according to claim 6, characterized in that the A layers are deposited by means of arc ion plating techniques.

9. Method of manufacturing a coated body according to claim 5, characterized in that the A layers and/or the B layers are deposited on the substrate by means of PVD techniques.

10. Method according to claim 9, characterized in that by depositing the A layers and/or the B layers reactive physical vapor deposition techniques are used.

11. Method according to claim 10, characterized in that the nitrogen fraction and/or at least one of the elements comprised in the X component of the coating system are incorporated from a reactive gas or from a reactive gas mixture in the A and/or B layers, respectively.

12. Method according to claim 9, characterized in that the multilayered film (10), i.e. both the A- and B-layers are deposited by means of arc ion plating techniques.

13. Method according to claim 12, characterized in that for adjusting the desired defect density in the layers A and B the coil current is adjusted correspondingly.

14. Method according to claim 9, characterized in that at least one target used as source material for depositing the A- and/or B-layers is made by powder metallurgy techniques.

* * * * *